(12) United States Patent
Chikyow et al.

(10) Patent No.: US 6,888,156 B2
(45) Date of Patent: May 3, 2005

(54) THIN FILM DEVICE

(75) Inventors: Toyohiro Chikyow, Tsukuba (JP); Hideomi Koinuma, Tokyo (JP); Masashi Kawasaki, Sagamihara (JP); Yoo Young Zo, Sagamihara (JP); Yoshinori Konishi, Yokosuka (JP); Yoshiyuki Yonezawa, Yokosuka (JP)

(73) Assignees: National Institute for Materials Science, Ibaraki (JP); Tokyo Institute of Technology, Tokyo (JP); Fuji Electric Corporate Research & Development, Ltd., Kanagawa (JP)

( * ) Notice: Subject to any disclaimer, the term of this patent is extended or adjusted under 35 U.S.C. 154(b) by 0 days.

(21) Appl. No.: 10/179,006

(22) Filed: Jun. 26, 2002

(65) Prior Publication Data

US 2003/0006406 A1 Jan. 9, 2003

(30) Foreign Application Priority Data

Jun. 29, 2001 (JP) ........................................ 2001-200000
Mar. 26, 2002 (JP) ........................................ 2002-087198

(51) Int. Cl.[7] ..................... H01L 29/06; H01L 21/0328; H01L 31/0336; H01L 31/072; H01L 31/109
(52) U.S. Cl. .............................. 257/12; 257/13; 257/37
(58) Field of Search ................................ 257/12–13, 37

(56) References Cited

FOREIGN PATENT DOCUMENTS

| JP | 3-160735 A | 7/1991 |
|----|------------|--------|
| JP | 3-160736 A | 7/1991 |
| JP | 3-187189 A | 8/1991 |
| JP | 08082612 | * 3/1996 |
| JP | 2002-003297 A | 1/2002 |

OTHER PUBLICATIONS

Yahoo! Search results for EPITAXIAL, pp. 1–3.
A. Miyake et al.,"Luminescent properties of ZnO thin films grown epitaxially on Si substrate", Journal of Crystal Growth, 214/215, 2000, pp. 294–298.
Oyo Buturi, vol. 68, p. 790 (1999).
Applied Physics, vol. 68, p. 798, (1999).
Oxide Electronics Report II, Japan Electronics and Information Technology Industries Association, pp. 135 to 141 (1997).

(Continued)

Primary Examiner—Thien F Tran
(74) Attorney, Agent, or Firm—Marina V. Schneller; Venable LLP

(57) ABSTRACT

The invention provides a thin film device where ionic crystals are epitaxially grown on a Si single crystal substrate through a proper buffer layer, and its for fabrication method. A ZnS layer is first deposited on a Si single crystal substrate. Ionic crystal thin films (an n-GaN layer, a GaN layer, and a p-GaN layer) are deposited thereon. The ZnS thin film is an oriented film excellent in crystallinity and has excellent surface flatness. When ZnS can be once epitaxially grown on the Si single crystal substrate, the ionic crystal thin films can be easily epitaxially grown subsequently. Therefore, ZnS is formed to be a buffer layer, whereby even ionic crystals having differences in lattice constants from Si can be easily epitaxially grown in an epitaxial thin film with few lattice defects on the Si single crystal substrate. The characteristics of a thin film device utilizing it can be enhanced.

4 Claims, 20 Drawing Sheets

OTHER PUBLICATIONS

*Japanese Journal of Applied Physics*, vol. 39 (2000).
*Appl. Phys. Lett.* 69, 3266 (1996).
*National Technical Report*, vol. 33, No. 6, p. 687 (1987).
*JSAP Catalog No. AP 021108–02*, Portions of the index of the 49th Spring Meeting, 2002 of The Japan Society of Applied Physics and Related Societies.
Y.Z. Yoo et al., "Fabrication of Epitaxial Wurtzite ZnS Film on Bare Si Substrate," Proceedings of the 2001 Spring JSAP annual meeting, 29a–K–7, 2001, p. 323.
Yoshinori Konishi et al., "Preparation of Epitaxial Thin Films On Si Substrate With A ZnS Buffer Layer," Proceedings of the 2002 Spring JSAP annual meeting, 28p–YB–8, 2002, p. 621.
Y.Z. Yoo, et al., "ZnO/ZnS Heteroepitaxy On Si By Laser–MBE," Proceedings of the 2002 Spring JSAP annual meeting, 28p–ZN–2, 2002, p. 315.
Akito Kuramata et al., "Continuous–Wave Operation InGaN Laser Diodes On SiC Substrates," Oyobuturi, The Japan Society of Applied Physics, Jul. 10, 1999, pp. 797–800, vol. 68, No. 7.
Seikoh Yoshida, "Electronic Devices Using GaN," Oyobuturi, The Japan Society of Applied Physics, Jul. 10, 1999, pp. 787–792, vol. 68, No. 7.
Von Robert Juza et al., "Solid Solution In Systems ZnS/MnS, ZnSe/MnSe and ZnTe/MnTe," Journal of Inorganic and General Chemistry, vol. 285, 1956, pp. 61–69.
Copy of U.S. Appl. No. 10/665,524.

* cited by examiner

THIN FILM DEVICE

This application is based on Japanese Patent Application Nos. 2001-200000 filed Jun. 29, 2001 and 2002-87198 filed Mar. 26, 2002, the contents of which are incorporated hereinto by reference.

BACKGROUND OF THE INVENTION

1. Field of the Invention

The present invention relates to a thin film device comprising a compound having ionic bonds (hereafter, it is also called ionic crystals) and its fabrication method, more specifically, to a high intensity light emitting device utilizing an ionic crystal thin film as a functional film (semiconductor laser), a metal insulator semiconductor field effect transistor (MISFET), a high-electron-mobility transistor (HEMT), a thin film capacitor, and the other electronic devices and thin film devices, and fabrication methods.

DESCRIPTION OF THE RELATED ART

Many devices using a nitride thin film have been proposed and realized, such as a high intensity light emitting device using a GaN thin film, a MISFET using an AlN/GaN thin film, an HETM using an AlGaN/GaN thin film. In addition to these, there are materials having various functions in ionic crystals such as oxides, fluorides, and sulfides. These are combined with a Si semiconductor, whereby a highly functional electronic device can be formed using the ionic crystal thin film as a functional film.

Among the electronic devices having been proposed so far, those described above can be enhanced in the characteristics of the devices by forming the ionic crystal thin film to be a high-quality epitaxial thin film with few crystal defects. However, it is hard to form the epitaxial thin film of these, having been conducting various attempts.

In the case of a GaN system, there are reports of depositing it on a sapphire substrate by the Metal Organic Chemical Vapor Deposition Method or gas source Molecular Beam Epitaxial Method (Oyo Buturi, vol. 68, p. 790 (1999)), and of depositing them on a SiC substrate by the reduced pressure Metal Organic Chemical Vapor Deposition Method (Applied Physics, vol. 68, p. 798, (1999)).

However, the sapphire substrate and the SiC substrate are expensive, thus preferably forming it on a Si substrate. In the mean time, it is hard to directly epitaxially grow an ionic bond thin film on the Si substrate. It is considered because silicon is a covalent crystal in which a material having a lattice constant a few percent different from Si is not grown pseudomorphicly on the substrate to have lattice defects. The lattice defects cause the mobility of carriers to be dropped, or cause the luminous efficiency of a luminescent layer or the lifetime of a thin film device to be deteriorated.

As a method for forming a thin film on the Si single crystal substrate, there is a method of interposing a buffer layer. Often used is a method in which a metal oxide oxidized easier than Si, such as $CeO_2$, $Y_2O_3$, and $ZrO_2$, is formed to prevent amorphous $SiO_2$ from being generated. However, it is inevitable to oxidize the Si surface, and there is a problem that the film quality of a buffer layer formed on $SiO_2$ is not so excellent. In addition, there is a problem that a buffer layer using TiN or TaN is not excellent as well because of generating SiNx.

SUMMARY OF THE INVENTION

The invention has been made in view of such conditions. The purpose is to provide a thin film device where ionic crystals are epitaxially grown on a Si single crystal substrate through a proper buffer layer, and its fabrication method.

To attain such the purpose, the invention is characterized by comprising a buffer layer comprised of a zinc sulfide layer deposited on a silicon single crystal substrate by epitaxial growth, and a compound thin film having ionic bonds deposited on the zinc sulfide layer by epitaxial growth.

Additionally, the invention is characterized by comprising a buffer layer comprised of a zinc sulfide layer deposited on a silicon single crystal substrate by epitaxial growth, and two kinds or more of compound thin films having ionic bonds deposited on the zinc sulfide layer by epitaxial growth.

Furthermore, the invention is characterized by comprising a buffer layer comprised of a zinc sulfide layer and a zinc oxide layer deposited on a silicon single crystal substrate by epitaxial growth, and a compound thin film having ionic bonds deposited on the buffer layer by epitaxial growth.

The invention is effective in the case where an ionic crystal thin film has a lattice constant closer to that of zinc oxide than that of zinc sulfide, in the case where it is an oxide, or in the case where it has hexagonal crystal symmetry.

Moreover, the invention is characterized in that the compound thin film is a thin film formed by laminating two kinds or more of compound thin films having ionic bonds.

Besides, the invention is characterized by comprising a buffer layer comprised of a zinc sulfide layer and a strontium titanate layer deposited on a silicon single crystal substrate by epitaxial growth, and a compound thin film having ionic bonds deposited on the buffer layer by epitaxial growth.

The invention is effective in the case where an ionic crystal thin film has a lattice constant closer to that of strontium titanate than that of zinc sulfide, in the case where it is an oxide, or in the case where it has cubic crystal symmetry.

Additionally, the invention is characterized in that the compound thin film is a thin film formed by laminating two kinds or more of compound thin films having ionic bonds.

Furthermore, the invention is characterized by comprising a buffer layer comprised of a zinc sulfide layer and a platinum group layer sequentially deposited on a silicon single crystal substrate by epitaxial growth, and a compound thin film having ionic bonds deposited on the buffer layer by epitaxial growth.

Moreover, the invention is characterized by comprising a buffer layer comprised of a zinc sulfide layer, a zinc oxide layer, and a platinum group layer sequentially deposited on a silicon single crystal substrate by epitaxial growth, and a compound thin film having ionic bonds deposited on the buffer layer by epitaxial growth.

Besides, the invention is characterized in that a metal of platinum groups is any one of rhodium, iridium, palladium, and platinum or an alloy of these, depositing a single layer film thereof or a plurality of layers of thin films.

These inventions are effective in the case where an ionic crystal thin film tends to generate reactants with a zinc sulfide layer and it is hard to be epitaxially grown because reactants are generated in a stage of thin film growth in the interface between the zinc sulfide layer and the ionic crystal layer.

Additionally, the invention is characterized in that the compound thin film is a thin film formed by laminating two kinds or more of compound thin films having ionic bonds.

Furthermore, the invention is characterized in that a metal nitride thin film is used as the compound thin film.

Moreover, the invention is characterized in that a metal oxide thin film is used as the compound thin film.

Besides, the invention is characterized in that a metal sulfide thin film is used as the compound thin film.

Additionally, the invention is characterized in that zinc sulfide in a molecular state is fed onto a silicon single crystal substrate under a reduced pressure, whereby zinc sulfide is epitaxially grown on the substrate, and a compound thin film having ionic bonds is epitaxially grown thereon.

Furthermore, the invention is characterized in that zinc sulfide in a molecular state is fed onto a silicon single crystal substrate under a reduced pressure, whereby zinc sulfide is epitaxially grown on the substrate, and two kinds or more of compound thin films having ionic bonds are sequentially epitaxially grown thereon.

Besides, the invention is characterized in that zinc sulfide is epitaxially grown on a silicon single crystal substrate, zinc oxide is epitaxially grown thereon, and a compound thin film having ionic bonds is further epitaxially grown thereon.

Additionally, the invention is characterized in that zinc sulfide is epitaxially grown on a silicon single crystal substrate, strontium titanate is epitaxially grown thereon, and a compound thin film having ionic bonds is further epitaxially grown thereon.

Furthermore, the invention is characterized in that zinc sulfide is epitaxially grown on a silicon single crystal substrate, a platinum group is epitaxially grown thereon, and a compound thin film having ionic bonds is further epitaxially grown thereon.

Moreover, the invention is characterized in that zinc sulfide in a molecular state is fed onto a silicon single crystal substrate under a reduced pressure, whereby zinc sulfide is epitaxially grown on the substrate.

Besides, the invention is characterized in that a metal nitride thin film is used as the compound thin film.

Additionally, the invention is characterized in that a metal oxide thin film is used as the compound thin film.

Furthermore, the invention is characterized in that a metal sulfide thin film is used as the compound thin film.

As described above, according to the invention, the ZnS buffer layer deposited on the Si substrate by epitaxial growth or the buffer layer having the ZnO/ZnS, STO/ZnS, and Pt/ZnS structures is interposed, whereby the thin film device where the ionic crystals are epitaxially grown on the Si substrate is easily deposited, expecting improvements in characteristics. Particularly, when GaN is formed as the ionic crystal, a thin film device using GaN can be fabricated at lower costs than traditional fabrication methods.

In addition, the buffer layer of the ZnO/ZnS, STO/ZnS, and Pt/ZnS structures is used, instead of using the single ZnS buffer layer, whereby evaporation of Zn, S or ZnS from the surface of the ZnS layer can be suppressed, thus serving to prevent the impurity contamination of these in the subsequent deposition of ionic crystals and also prevent contamination over a thin film fabricating apparatus.

The above and other objects, effects, features and advantages of the present invention will become more apparent from the following description of embodiments thereof taken in conjunction with the accompanying drawings.

BRIEF DESCRIPTION OF THE DRAWINGS

The teachings of the invention can be readily understood by considering the following detailed description in conjunction with the accompanying drawings, in which:

FIG. 3A shows the measurement results of 2Θ-ω scans, and FIG. 3B shows a diagram illustrating the measurement results of Phi (Φ) scans of W-ZnS (105);

FIG. 16A shows a ZnS/Si interface, and FIG. 16B shows a STO/ZnS interface;

DETAILED DESCRIPTION OF PREFERRED EMBODIMENTS

Hereafter, embodiments of the invention will be described with reference to the drawings.

[Embodiment 1]

Figure 1:
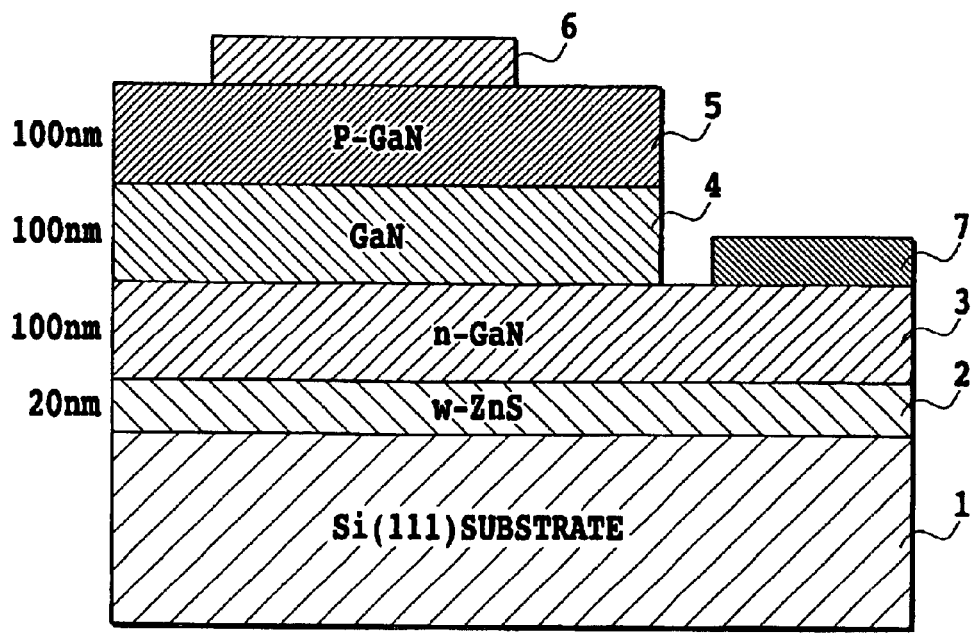
FIG. 1 shows a diagram illustrating a configuration of a GaN light emitting diode formed according to the invention.

FIG. 1 shows a diagram illustrating a configuration of a GaN light emitting diode device formed according to the invention. In the drawing, 1 denotes a Si (111) single crystal substrate, 2 denotes a W-ZnS layer (20 nm; W indicates zinc sulfide of the wurtzite structure) deposited on the single crystal substrate 1, 3 denotes an n-GaN layer 3 (100 nm) deposited on the W-ZnS layer 2, 4 denotes a GaN layer (100 nm) deposited on the n-GaN layer, which functions as a luminescent layer, 5 denotes a p-GaN layer (100 nm) deposited on the GaN layer 4, 6 denotes an upper electrode formed on the p-GaN layer 5, and 7 denotes a lower electrode formed on the n-GaN layer 3.

The Si (111) single crystal substrate was removed of a natural oxide film with Hydrogen Fluoride, cleaned with water, and then placed in a deposition chamber for vacuuming for about ten minutes. ZnS was deposited about 20 nm in thickness at a substrate temperature of 750° C. by Pulsed Laser Deposition (PLD). To form 100 nm in thickness of the n-type GaN layer 3, Si was doped. In the middle, the GaN layer doped no carriers was formed 100 nm in thickness. To form the p-type GaN layer 5, Mg was doped.

In the invention, ZnS having a lattice constant very close to that of Si is used for a buffer layer. More specifically, the ZnS layer 2 was first epitaxially grown on the Si single crystal substrate, and the object layered thin film of ionic crystals (the n-GaN layer 3, the GaN layer 4, and the p-GaN layer 5) was deposited thereon to form an electronic device.

The ZnS layer 2 has the hexagonal wurtzite structure and an a-axis of 3.820 angstroms. It is smaller merely 0.5 percent than the a-axis length of 3.840 angstroms when the Si (111) single crystal substrate 1 is considered to be hexagonal, it is matched with the crystal system, and it has excellent matching. The Gibbs energy of silicon sulfide $SiS_2$ ($\Delta G$=-206.5 kJ/mol) has an absolute value slightly greater than the Gibbs energy of zinc sulfide ZnS ($\Delta G$=-188.28 kJ/mol in wurtzite). However, in non-equilibrium deposition using PLD, deposition experiments revealed that c-axis-oriented ZnS is epitaxially grown without generating $SiS_2$ in the Si interface. This ZnS thin film is an oriented film excellent in crystallinity and also has excellent surface flatness.

Figure 2:
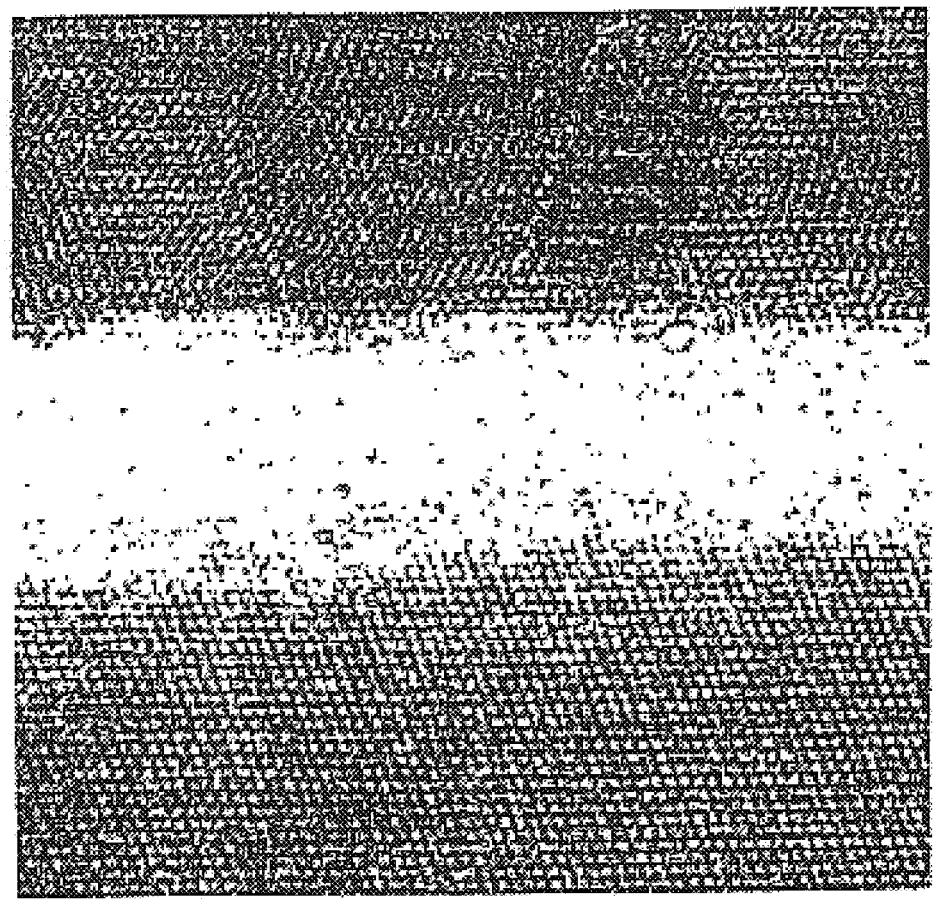
FIG. 2 shows a diagram illustrating a sectional structure of a ZnS thin film by transmission electron microscopic observation.

FIG. 2 shows a diagram illustrating a sectional structure of the ZnS thin film by transmission electron microscopic observation, which is a diagram illustrating a sectional image of the ZnS/Si (111) thin film by transmission electron microscopy, the thin film was deposited in the invention. ZnS crystals are matched and grown to the Si substrate. An amorphous portion in the interface is seen about three to five nm, but ZnS is clearly epitaxially grown. Thus, the amorphous portion is considered to have been deposited in the growing process of the ZnS thin film, and the $SiS_2$ layer is considered to be hardly deposited in the initial stage of the ZnS growth.

Figure 3A:
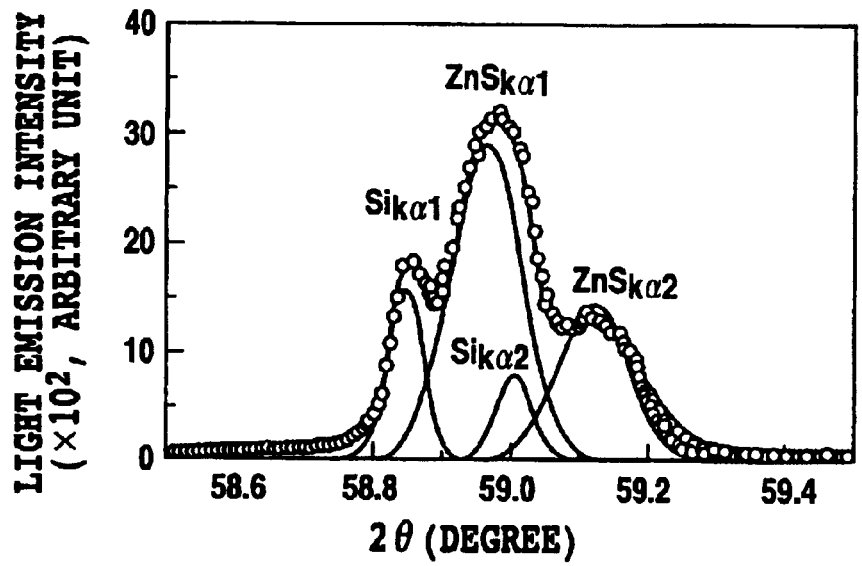
FIGS. 3A and 3B show diagrams illustrating the measurement results of a ZnS buffer layer in X-Ray Diffraction (XRD)
Figure 3B:
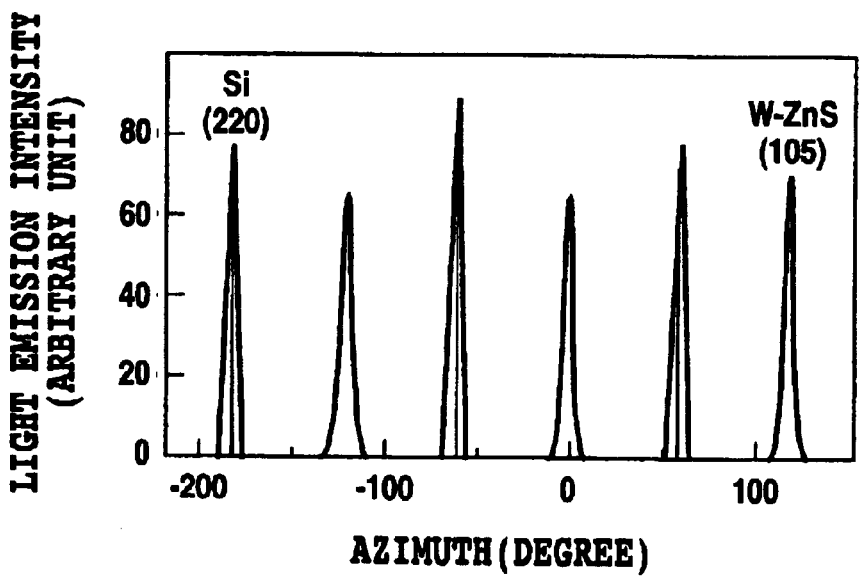

FIGS. 3A and 3B show diagrams illustrating the measurement results of the ZnS buffer layer in X-Ray Diffraction. FIG. 3A shows the measurement results of 2Θ-ω scans. FIG. 3B shows a diagram illustrating the measurement results of Phi (φ) scans of W-ZnS (105), indicating that ZnS of the hexagonal wurtzite structure is epitaxially grown on the Si (111) single crystal substrate 1. A half value width of the rocking curve in the (004) peak of the W-ZnS layer is 0.28 deg., having excellent crystallinity.

Figure 4:
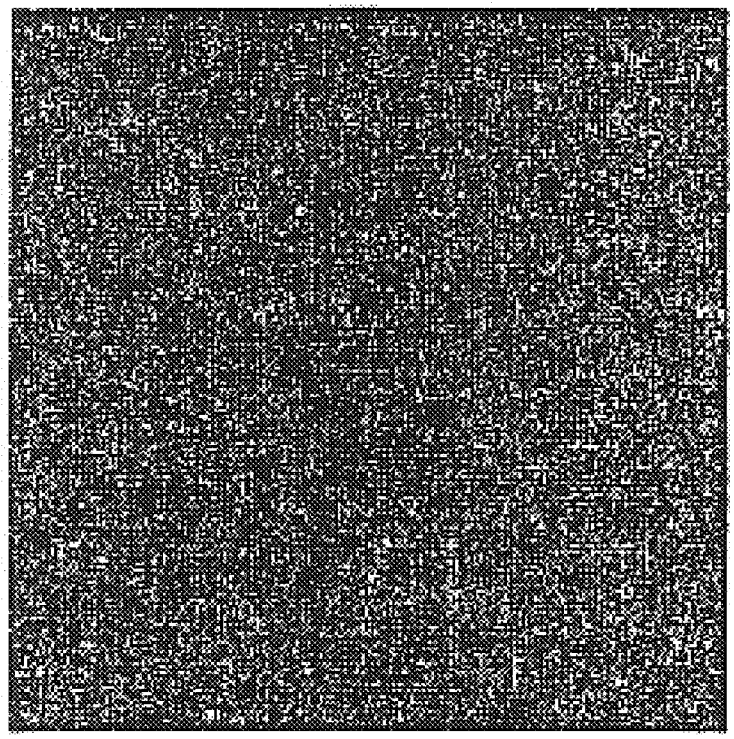
FIG. 4 shows a diagram illustrating an image of a ZnS/Si (111) thin film by atomic force microscopy (AFM)

FIG. 4 shows a diagram illustrating an image of the ZnS/Si (111) thin film by atomic force microscopy (AFM). The surface flatness is a few nm in the root means square (RMS), being significantly flat. The invention is characterized in that a significantly flat ZnS buffer layer is actually deposited with high crystallinity.

In addition, once ZnS can be epitaxially grown on the Si single crystal substrate, the ionic crystal thin film can be easily epitaxially grown subsequently.

For example, in the case of GaN, GaN is a hexagon having the a-axis of 3.160 angstroms about 18 percent as small as Si, and is hard to be epitaxially grown on Si. However, it can be epitaxially grown on ZnS having about 17 percent of lattice mismatch. A degree of polarity (an index indicating ionic bonds) in ZnS is as large as 0.75, and a degree of polarity in GaN is also as large as 0.6. The interface between those having high polarity can be lattice-matched in a long period structure for easy epitaxial junction. The phenomenon is called domain matching or higher order epitaxy (see, Oxide Electronics Report II, Japan Electronics and Information technology Industries Association, PP. 135 to 141 (1997)). Si is 100 percent covalent bonding (the degree of polarity is zero percent), and thus higher order epitaxy is hard to occur.

Figure 5:
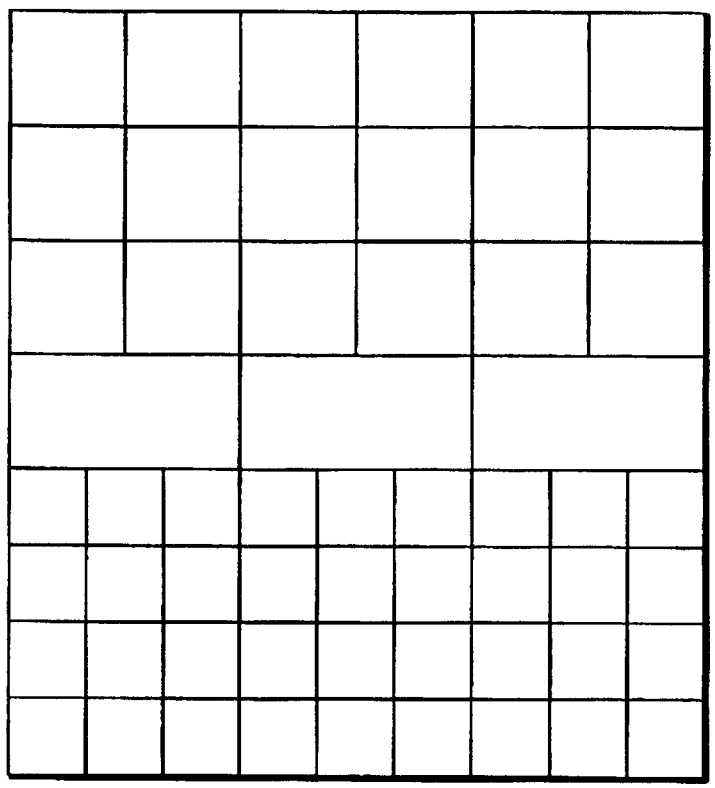
FIG. 5 shows a conceptual diagram illustrating higher order epitaxy.

FIG. 5 shows a diagram illustrating a conceptual diagram of higher order epitaxy, indicating a combination that a lattice constant is 3:2.

Therefore, ZnS is formed to be a buffer layer, and thus even ionic crystals having differences in a lattice constant from Si can be easily deposited in an epitaxial thin film with few lattice defects on the Si single crystal substrate. The characteristics of thin film devices utilizing it can be enhanced.

Figure 6:
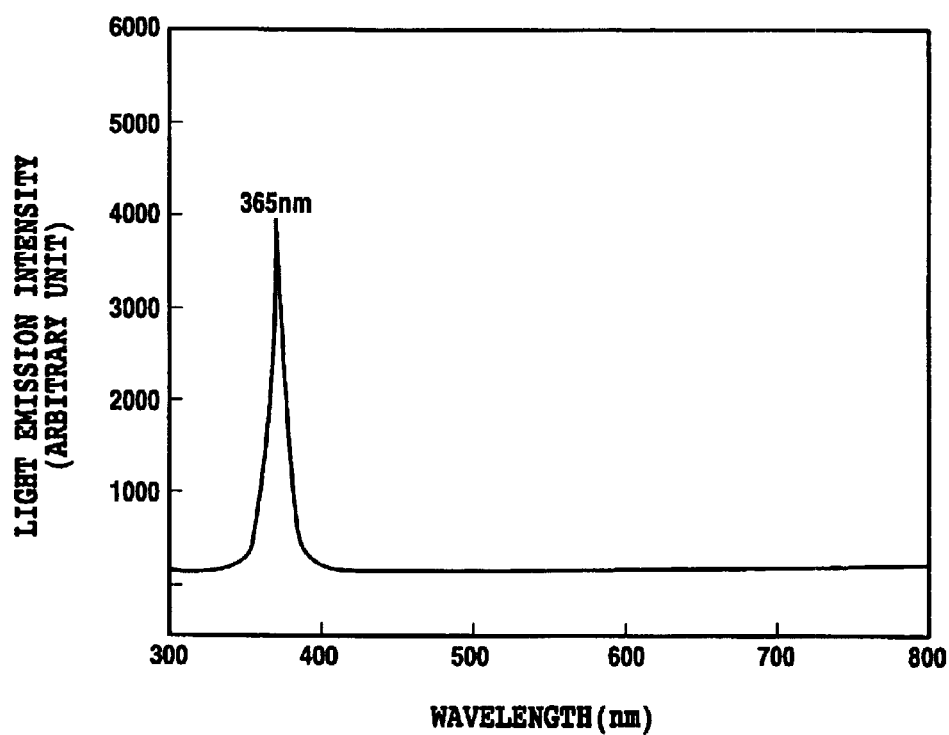
FIG. 6 shows a diagram illustrating the emission spectrum of a GaN light emitting diode fabricated in the invention.

FIG. 3A shows peaks of Si (222) and W-ZnS (004) in which the lattice constants of both of them are almost equal, and thus overlapped peaks are obtained. Both of them have $K\alpha 1$ and $K\alpha 2$ peaks, respectively, thus decomposing into four peaks in total. ZnS is not observed in the other orientations; it is found to be c-axis oriented. FIG. 3B shows diffraction lines in symmetries for six times, thus revealing that it is epitaxially grown in the same orientation as Si (220) in plan. FIG. 6 shows the emission spectrum of the GaN light emitting diode device fabricated. Ultraviolet emission was confirmed. As known, In is doped to emit blue light. Therefore, it is also possible that GaN is doped with In to obtain blue light emission in the invention.

Additionally, in the embodiment described above, the high intensity light emitting device utilizing the ionic crystal thin film as the functional film has been described. However, it can also be adapted to metal insulator semiconductor field effect transistors (MISFET), high electron mobility transistors (HEMT), thin film capacitors, various sensors, optical switching thin film devices, ferroelectric random access memories (FRAM), magnetic random access memories (MRAM), superconducting devices, and the other electronic devices and thin film devices.

So far, it has been proposed to utilize ZnS as a buffer. For example, there are Japanese Patent Application Laid-open Nos. 3-160735 (1991), 3-160736 (1991), and 3-187189 (1991). However, these publications have no data clearly showing crystallinity or film quality of ZnS.

Traditionally, the ZnS thin film has been deposited mainly by molecular beam epitaxy, metal organic chemical vapor deposition, vacuum deposition, and sputtering. It has been difficult to deposit the ZnS thin film with excellent crystallinity, because sulfur has a high vapor pressure and thus only a thin film with no sulfur is obtained unless at relatively low substrate temperatures. Therefore, temperatures for thin film deposition have been ranged from 200 to 400° C. However, constituent atoms could not generate sufficient migration at low substrate temperatures to deteriorate the crystallinity of ZnS.

The invention is characterized by a method for fabricating the ZnS thin film. The vapor pressure of ZnS molecules is relatively lower than that of sulfur or zinc atoms, about a few mTorrs even at a temperature of 800° C. Then, ZnS in a molecular state was fed onto a substrate at high substrate temperatures of about 600 to 800° C. More specifically, Pulsed laser Deposition (PLD) was used. Excimer laser used in PLD is a light having short wavelength; it is 248 nm in KrF, having high energy of about two eV. Light of short wavelength and high density is irradiated onto a ZnS sintered compact (target) in pulse, whereby various particles having high energy such as sulfur atoms, zinc atoms, and ZnS molecules are evaporated from the ZnS target surface and reach the substrate surface. The ZnS molecules among the particles reached cause migration on the substrate surface by high kinetic energy and thermal energy due to high substrate temperatures, and ZnS is crystallized at proper lattice positions. Extra sulfur atoms or zinc atoms are again evaporated from the substrate because of high vapor pressure, and the ZnS thin film in a single crystal is deposited as the stoichiometric mixture ratio.

In the invention, high-quality ZnS could be deposited successfully, as described above. It is possible to deposit the high-quality ZnS thin film when ZnS in a molecular state can be fed onto the substrate, not limiting to PLD. For example, atomic sulfur and zinc are fed onto the substrate in traditional molecular beam epitaxy, vapor deposition, and sputtering, or an organic compound containing zinc and hydrogen sulfide are fed onto the substrate in metalorganic chemical vapor deposition.

Then, it is considered that the high-quality ZnS thin film can be deposited by these methods when ZnS molecules can be efficiently generated and fed onto the substrate by irradiating light or ion beams onto the substrate surface. Even on the high-quality ZnS buffer layer thus deposited, ionic crystals can be epitaxially grown subsequently, a high-quality ionic crystal thin film can be obtained, and devices utilizing it can be enhanced in characteristics. Thus, the invention is considered to have inventive steps.

The advantage to utilize ZnS as a buffer layer for the Si substrate is that the crystal structure of ZnS takes two forms, the hexagonal wurtzite structure (W-ZnS) and the cubic zinc blende structure (ZB-ZnS; ZB indicates the Zinc Blende structure). It is possible to separately form ZnS of the wurtzite structure on a Si (111) substrate and ZnS of the zinc blend structure on a Si (100) substrate. Therefore, the Si (111) substrate is used when ionic crystals having hexagonal symmetry are formed, the Si (100) substrate is used when ionic crystals having cubic symmetry are formed, and then the ZnS buffer layer is formed. Thus, each of ionic crystals can be formed thereon easily. Additionally, in Si devices, a schottky-barrier diode uses the Si (111) substrate and an integrated circuit uses the Si (100) substrate in general. ZnS can make an excellent buffer layer for both substrates in fabricating a complex device of a Si device and a functional thin film.

Using the zinc sulfide layer deposited on the silicon single crystal substrate by epitaxial growth and the zinc oxide layer epitaxially grown on the zinc sulfide layer (these are combined and called a ZnO/ZnS buffer layer) as a substrate is effective for growing ionic crystals, which is an excellent scheme to obtain the high-quality ionic crystal thin film. The method for fabricating the ZnO/ZnS buffer layer proposed in the invention is a method for providing an excellent ZnO/ZnS buffer layer having not existed before. The method allows ionic crystals to be epitaxially grown thereon with excellent crystallinity, which is a scheme to provide a thin film device improved in characteristics. The invention is effective for the case where an ionic crystal thin film has a lattice constant closer to that of zinc oxide than that of zinc sulfide, or the case where it is an oxide. Furthermore, in the case where it has hexagonal crystal symmetry, it becomes a particularly effective scheme by using the top of the Si (111) substrate.

ZnO also has the same crystal structure as ZnS, but the lattice constant of the a-axis is smaller by 15 percent. The large lattice mismatch might cause crystallinity in the interface to be unstable in depositing ZnO. Additionally, the Gibbs energy of ZnO ($\Delta G=-318.32$ kJ/mol) has an absolute value greater than that of ZnS ($\Delta G=-188.28$ kJ/mol when it is wurtzite). Therefore, the ZnS buffer layer surface is oxidized in an oxidized atmosphere, and the crystallinity of the ZnS buffer layer might be impaired.

As for a method for avoiding this, a method is proposed that oxygen is not introduced into a deposition chamber in the initial stage in depositing a metal oxide thin film, a metal oxide layer is deposited in a layer of a few atoms or more, and then oxygen is introduced. When the metal oxide thin film is ZnO, a ZnO/ZnS/Si thin film can be formed.

An attempt to epitaxially grow the ZnO thin film on the ZnS thin film has already been disclosed in two papers by A. Miyake et al. at Shizuoka University. The summary of their methods for fabricating the ZnO/ZnS thin film will be described.

A first paper is published in Journal of crystal Growth, 214/215 (2000). First, a Si (111) substrate is cleaned with acid, a ZnS thin film is deposited about 50 nm in thickness at a substrate temperature of 200° C. by vacuum vapor deposition, and a ZnO thin film is deposited at a substrate temperature of 400 to 600° C. by vacuum deposition. After deposition, annealing is conducted in an atmosphere at a temperature of 800 to 1000° C. for one hour to enhance the crystallinity of the ZnO thin film. It was reported that the crystallinity of the sample annealed in the atmosphere at a temperature of 1000° C. has a half value width of 0.276 deg. in the rocking curve of the XRD (0002) peak of ZnO.

A second paper is published in Japanese Journal of Applied Physics vol. 39 (2000). First, a Si (111) substrate is cleaned with acid, a ZnS thin film is deposited at a substrate temperature of 200° C. by electron beam deposition, and it is annealed in the atmosphere at a temperature of 800° C. for 15 hours, whereby the ZnS surface is oxidized to obtain a ZnO/ZnS/Si thin film. It is reported that the half value width of the rocking curve of the XRD (0002) peak in the ZnO thin film is 0.255 deg. depositing the ZnO thin film having excellent crystal bonds. In both methods, the essential conditions are: 1) depositing ZnS at a substrate temperature of 200° C. by vapor deposition, and 2) annealing in the atmosphere at a temperature of 800° C. or above.

Then, one of the applicants conducted additional experiments. The result revealed that a ZnS/Si thin film is deposited by Pulsed Laser Deposition described above and a ZnO/ZnS/Si thin film annealed in the atmosphere at a temperature of 900° C. for two hours, which has a bad flatness; there are many holes inside the ZnS thin film by scanning electron microscopic observation.

Figure 7:
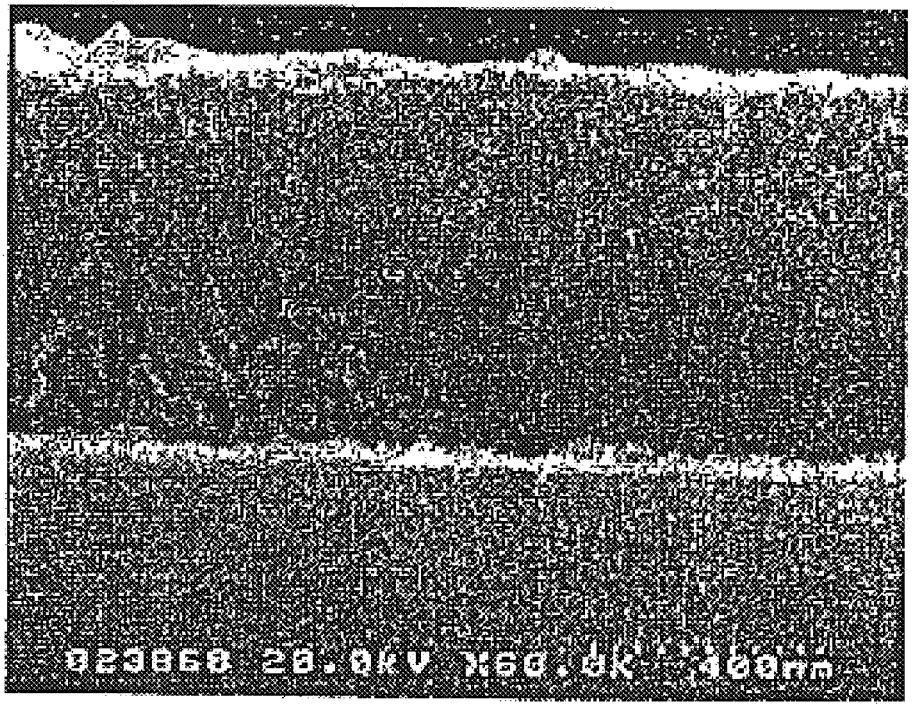
FIG. 7 shows a diagram illustrating a sectional image of a ZnO/ZnS/Si thin film by scanning electron microscopy, the thin film was obtained by additional experiments.

FIG. 7 shows a diagram illustrating a sectional image of the ZnO/ZnS/Si thin film by scanning electron microscopy; the thin film was obtained by the additional experiments. Accordingly, this deposition method cannot obtain the ZnO/ZnS/Si thin film with excellent crystallinity and flatness.

Figure 8:
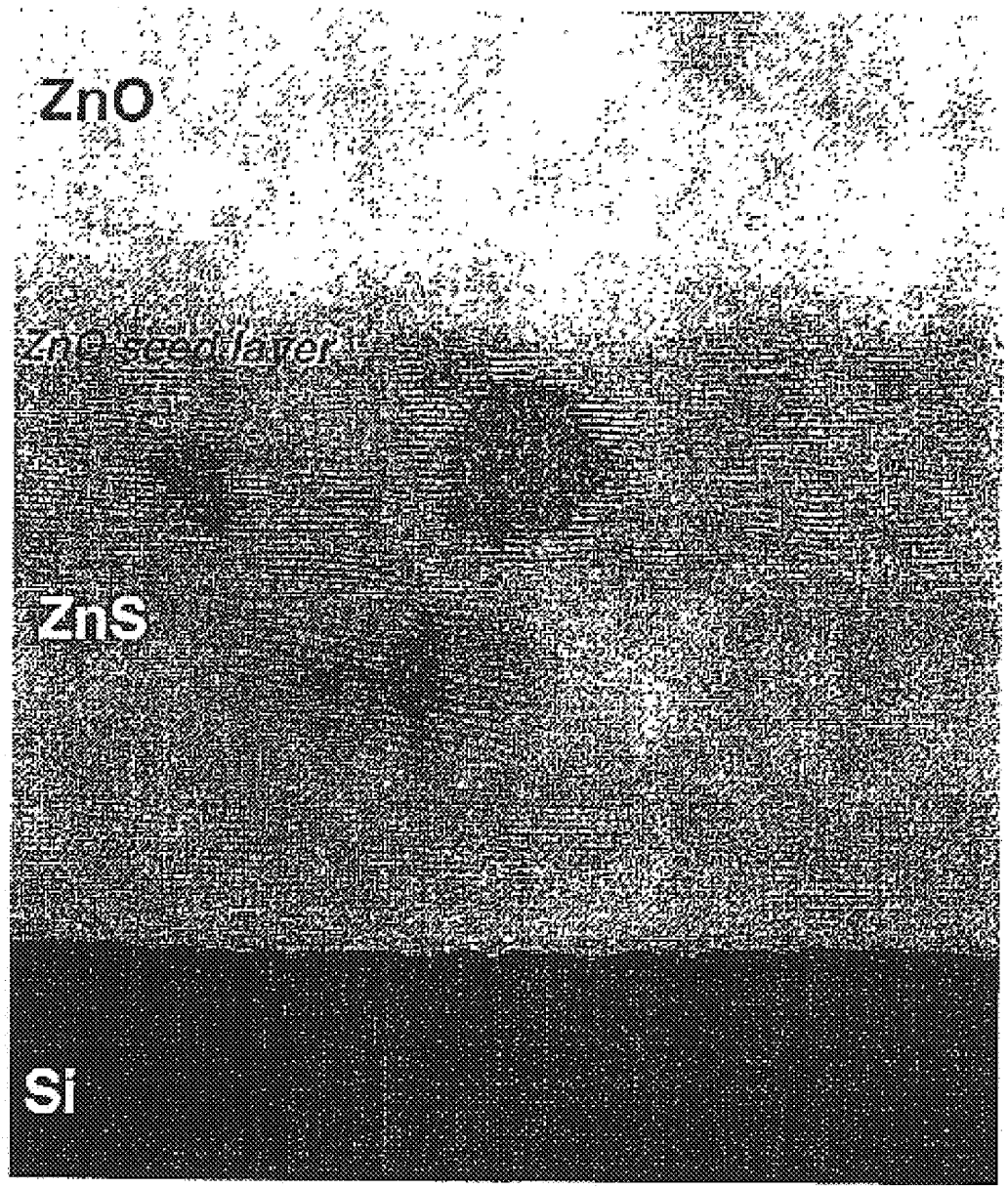
FIG. 8 shows a diagram illustrating a sectional image of the ZnO/ZnS/Si thin film by transmission electron microscopy, the thin film was obtained according to the invention.

FIG. 8 shows a diagram illustrating a sectional image of the ZnO/ZnS/Si thin film by transmission electron microscopy, which thin film was obtained according to the invention, and shows the sectional image of the ZnO/ZnS/Si thin film by transmission electron microscopy, the thin film was deposited by the method in which oxygen is not introduced into a deposition chamber at the initial stage in depositing the ZnO thin film proposed in the invention, and oxygen is introduced after a ZnO layer of a few atom layers or more is deposited. It reveals that the ZnO thin film has been deposited with high crystallinity.

Figure 9:
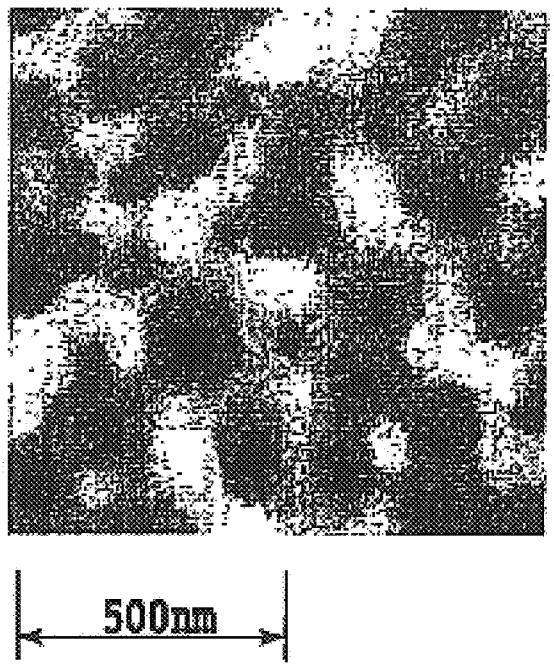
FIG. 9 shows a diagram illustrating an image of the surface appearance of the ZnO/ZnS/Si thin film by atomic force microscopy, the thin film was obtained according to the invention.

FIG. 9 shows a diagram illustrating an image of the surface appearance of the ZnO/ZnS/Si thin film by atomic force microscopic observation; the thin film was obtained according to the invention. It is revealed that the root means square (RMS) is 10 nm or under and the ZnO/ZnS/Si thin film with excellent flatness is obtained.

The papers of Shizuoka University describe that ZnS makes the buffer for ZnO because the structures are resembled. They do not take into account of the height of ionic bonds. Thus, the idea cannot be lead from the papers at once in which ZnS having high ionic bonds is formed into a buffer, whereby ionic crystals are domain-matched to allow easy epitaxially growth. Additionally, the papers do not point that the ZnO/ZnS/Si structure itself is appropriate as the buffer for the ionic crystal thin film, which is a novel structure having not been reported before.

Observing the sectional image by transmission electron microscopy shown in FIG. 8 revealed the reason why the ZnO/ZnS buffer layer obtained according to the invention has excellent film quality. When ZnO is deposited on ZnS, the surface of ZnS is partially oxidized, and it becomes a minute crystal nucleus to grow ZnO, in addition to easy epitaxial growth because of domain matching. It is considered to further enhance the crystallinity of the ZnO layer.

[Embodiment 2]

Figure 10:
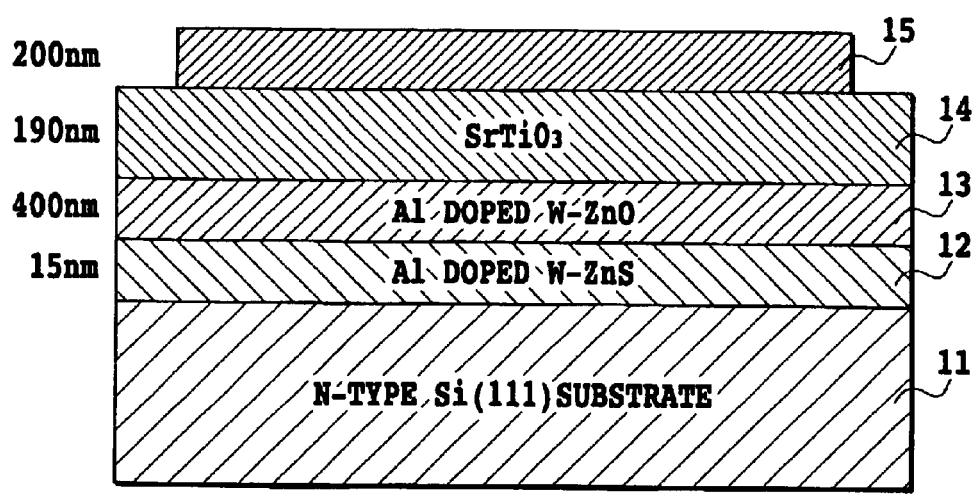
FIG. 10 shows a diagram illustrating a configuration of a thin film capacitor device fabricated according to the invention.

FIG. 10 shows a diagram illustrating a configuration of a thin film capacitor device fabricated according to the invention. In the drawing, 11 denotes an n-type Si (111) substrate, 12 denotes an Al doped W-ZnS layer (15 nm) deposited on the Si (111) substrate 11, 13 denotes an Al doped W-ZnO layer (400 nm) deposited on the Al doped W-ZnS layer 12, 14 denotes a SrTiO$_3$ layer (190 nm) deposited on the Al doped W-ZnO layer 13, and 15 denotes an upper electrode (200 nm) formed on the SrTiO$_3$ layer 14.

More specifically, the n-type Si (111) substrate 11 was used to deposit the wurtzite structural ZnS layer 12 of 15 nm in thickness, and the ZnO layer 13 was deposited 400 nm in thickness thereon. Subsequently, the SrTiO$_3$ dielectric layer 14 was deposited, and the Pt upper electrode 15 was formed. A lower electrode is to be the Si substrate 11.

When ionic crystals such as SrTiO$_3$ or the other perovskite oxides having a lattice constant close to that of platinum groups are epitaxially grown, a platinum group such as Pt is inserted for the under layer to allow the crystallinity of the ionic crystals to be enhanced. Also in the embodiment 2, the Pt layer is inserted under the STO layer 10 nm in thickness, whereby the crystallinity of STO can be enhanced. The platinum groups have a lattice constant closer to that of STO than that of ZnO. Additionally, the platinum groups have the face centered cubic structure, utilizing the properties that the platinum groups are oriented in the (100) orientation, the (111) orientation or the other orientations by the crystal symmetry of the under layer.

The thin film capacitor device having such the structure is fabricated as follows. First, the n-type Si (111) single crystal substrate with low resistance was removed of a natural oxide film with Hydrogen Fluoride, cleaned with water, and then placed in a deposition chamber for vacuuming for about ten minutes. ZnS doped with one percent of Al was deposited about 15 nm in thickness at a substrate temperature of 750° C. by pulsed laser deposition. Then, ZnO doped with one percent of Al was deposited about 400 nm in thickness by pulsed laser deposition. At the initial stage of ZnO deposition, oxygen was not introduced, and deposition was conducted in vacuum. After ZnO was deposited a few nm in thickness, $5 \times 10^{-4}$ Torrs of oxygen was introduced. Subsequently, SrTiO$_3$ was deposited about 190 nm in thickness by pulsed laser deposition. Lastly, the upper electrode of Pt having an area of 0.5 mm in diameter was formed about 200 nm in thickness by sputtering. Both ZnS and ZnO were doped with Al to have conductivity, and thus a capacitor having the Si substrate itself formed into the lower electrode was formed.

Figure 11:
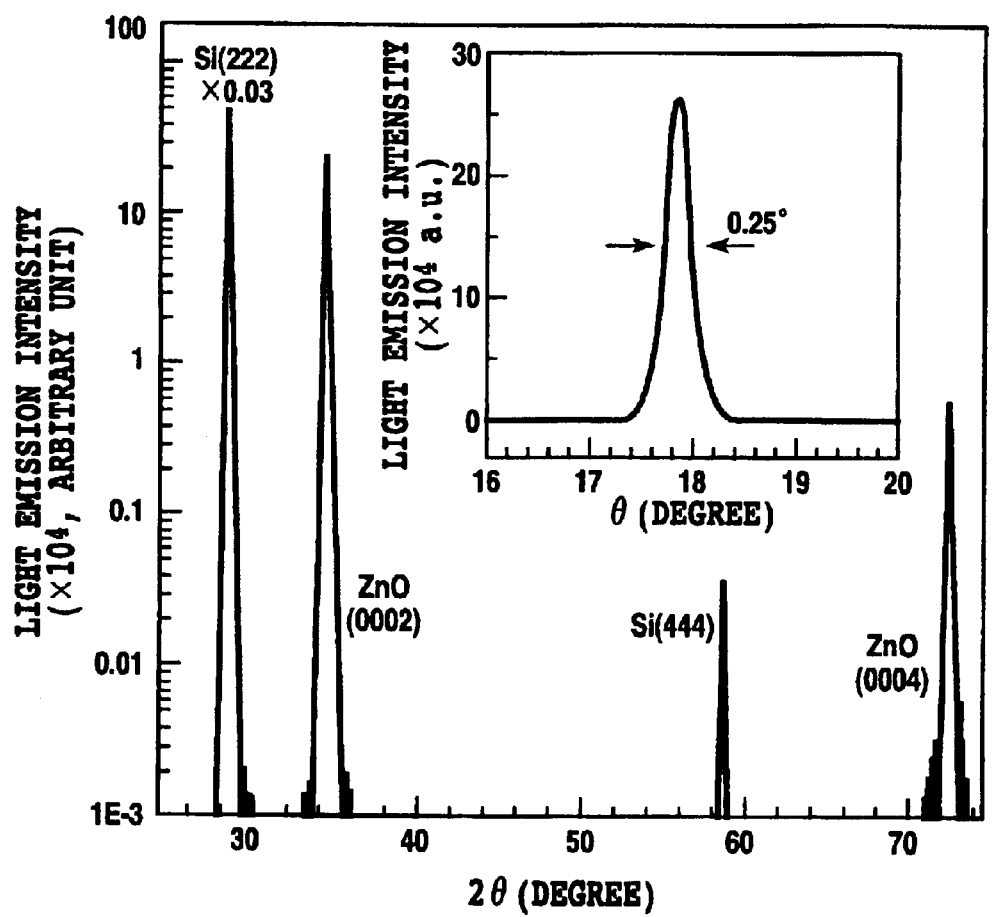
FIG. 11 shows diagrams illustrating the measurement results of XRD 2θ-ω scans of a ZnO/ZnS buffer layer deposited according to the invention, and the rocking curve of a ZnO (0002) peak.

FIG. 11 shows diagrams illustrating the measurement results of XRD 2θ-ω scans of the ZnO/ZnS buffer layer deposited according to the invention and the rocking curve of the ZnO (0002) peak. The (222) and (444) peaks of the Si substrate and the (0002) and (0004) peaks of the ZnO thin film are seen. The peaks of the ZnS thin film are overlaid on the peaks of the Si substrate and thus are not seen. A drawing inserted in the drawing shows the rocking curve of the ZnO (0002) peak. The half value width is 0.25 deg., very narrow, indicating ZnO being epitaxially grown.

Figure 12:
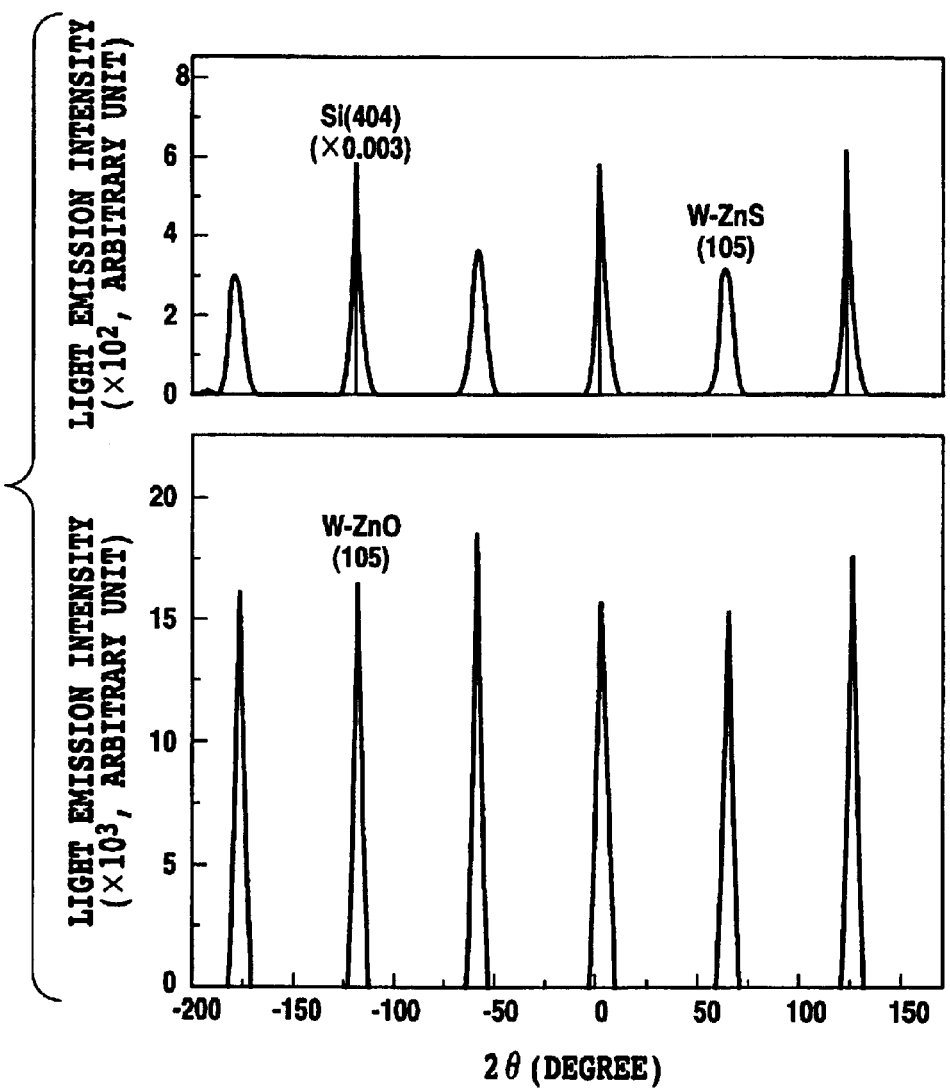
FIG. 12 shows diagrams illustrating the measurement results of XRD Phi (φ) scans of a ZnO/ZnS/Si (111) thin film deposited according to the invention.

FIG. 12 shows diagrams illustrating the measurement results of XRD Phi (φ) scans of the ZnO/ZnS/Si (111) thin film deposited according to the invention. The drawing shown above illustrates symmetries for six times, thus indicating the (105) peak of ZnS of the hexagonal wurtzite structure being epitaxially grown in the same orientation as Si (404) in plan. The drawing shown below indicates that the (105) peak of ZnO of the hexagonal wurtzite structure is epitaxially grown in the same orientation as Si (404) in plan as similar to ZnS.

Figure 13:
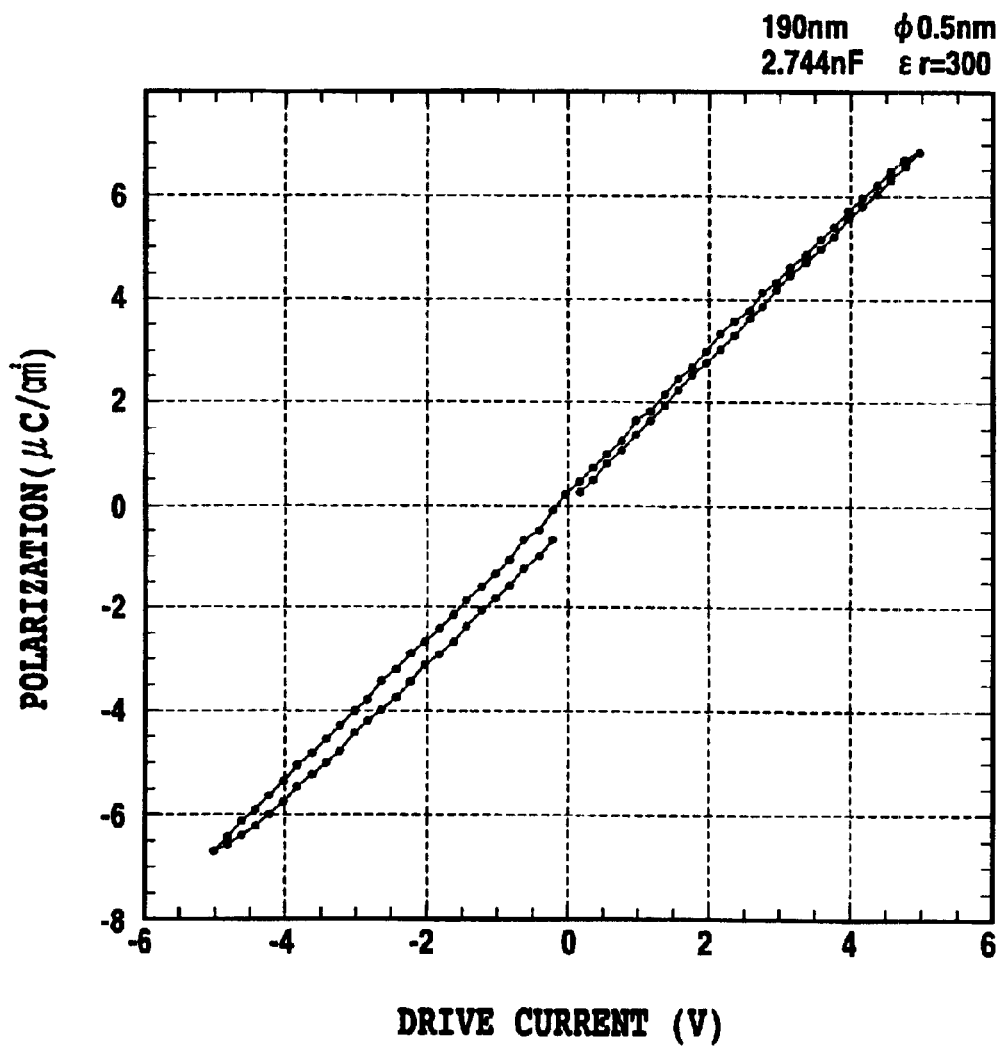
FIG. 13 shows a diagram illustrating the measurement results of the hysteresis curve of a capacitor at ±5V, which was fabricated according to the invention.

FIG. 13 shows a diagram illustrating the measurement results of the hysteresis curve in the capacitor at ±5V fabricated according to the invention, indicating appearances of polarization against drive voltage. Accordingly, it was revealed that the SrTiO$_3$ layer shows a dielectric constant as high as about 300.

It is effective to use the zinc sulfide layer deposited on the silicon single crystal substrate by epitaxial growth and the SrTiO$_3$ (it is abbreviated and called STO) layer deposited on the zinc sulfide layer by epitaxial growth (they are combined and called the STO/ZnS buffer layer) as a substrate, which is an excellent scheme to deposit an ionic crystal thin film with high film quality. It is possible to epitaxially grow ionic crystals on the STO/ZnS buffer layer proposed in the invention with excellent crystallinity, which is a scheme to provide a thin film device enhanced in characteristics. The invention is effective in the case where an ionic crystal thin film has a lattice constant closer to that of STO than zinc sulfide or the case where it is an oxide. Furthermore, in the case where it has cubic crystal symmetry, it becomes a particularly effective scheme by using the top of the Si (100) substrate.

[Embodiment 3]

Figure 14:
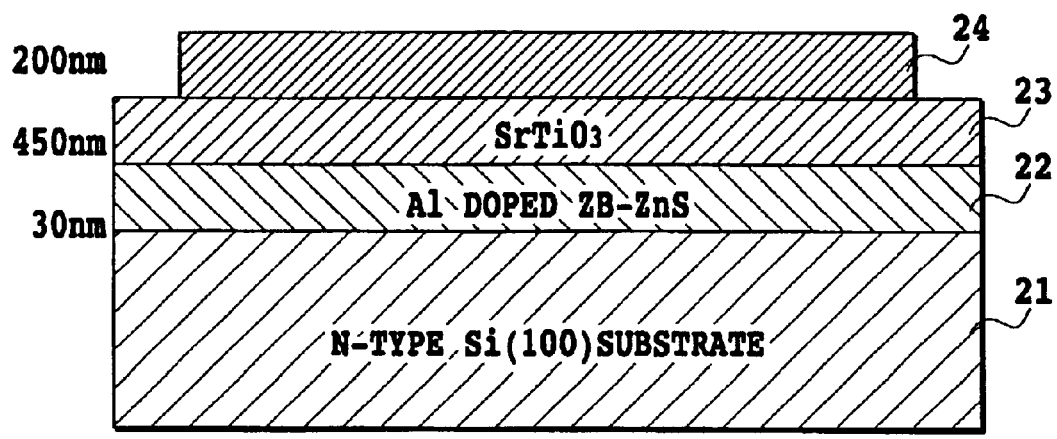
FIG. 14 shows a diagram illustrating a configuration of a thin film capacitor device fabricated according to the invention.

FIG. 14 shows a diagram illustrating a configuration of a thin film capacitor device fabricated according to the invention. In the drawing, 21 denotes an n-type Si (100) substrate, 22 denotes an Al doped ZB-ZnS layer (40 nm) deposited on the n-type Si (100) substrate 21, 23 denotes a SrTiO$_3$ layer (450 nm) deposited on the Al doped ZB-ZnS layer 22, and 24 denotes an upper electrode (200 nm) formed on the SrTiO$_3$ layer 23.

More specifically, the n-type Si (100) single crystal substrate 21 was used to deposit the zinc blend structural ZnS layer 22 of 30 nm in thickness, the SrTiO$_3$ dielectric layer 23 was deposited thereon, and subsequently the Pt upper electrode 24 was formed. A lower electrode is to be the Si substrate 21.

The thin film capacitor device having such the structure is fabricated as follows. First, the n-type Si (100) single crystal substrate with low resistance was removed of a natural oxide film with Hydrogen Fluoride, cleaned with water, and then placed in a deposition chamber for vacuuming for about ten minutes. ZnS doped with one percent of Al was deposited about 40 nm in thickness at a substrate temperature of 700° C. by pulsed laser deposition. Then, SrTiO$_3$ was deposited about 400 nm in thickness by pulsed laser deposition. At the initial stage of SrTiO$_3$ deposition, oxygen was not introduced, and deposition was conducted in vacuum. After SrTiO$_3$ was deposited a few nm in thickness, $5\times10^{-4}$ Torrs of oxygen was introduced. Lastly, the upper electrode of Pt having an area of 0.5 mm in diameter was formed about 200 nm in thickness by sputtering. ZnS was doped with Al to have conductivity, and thus a capacitor having the Si substrate itself formed into the lower electrode was formed.

Figure 15:
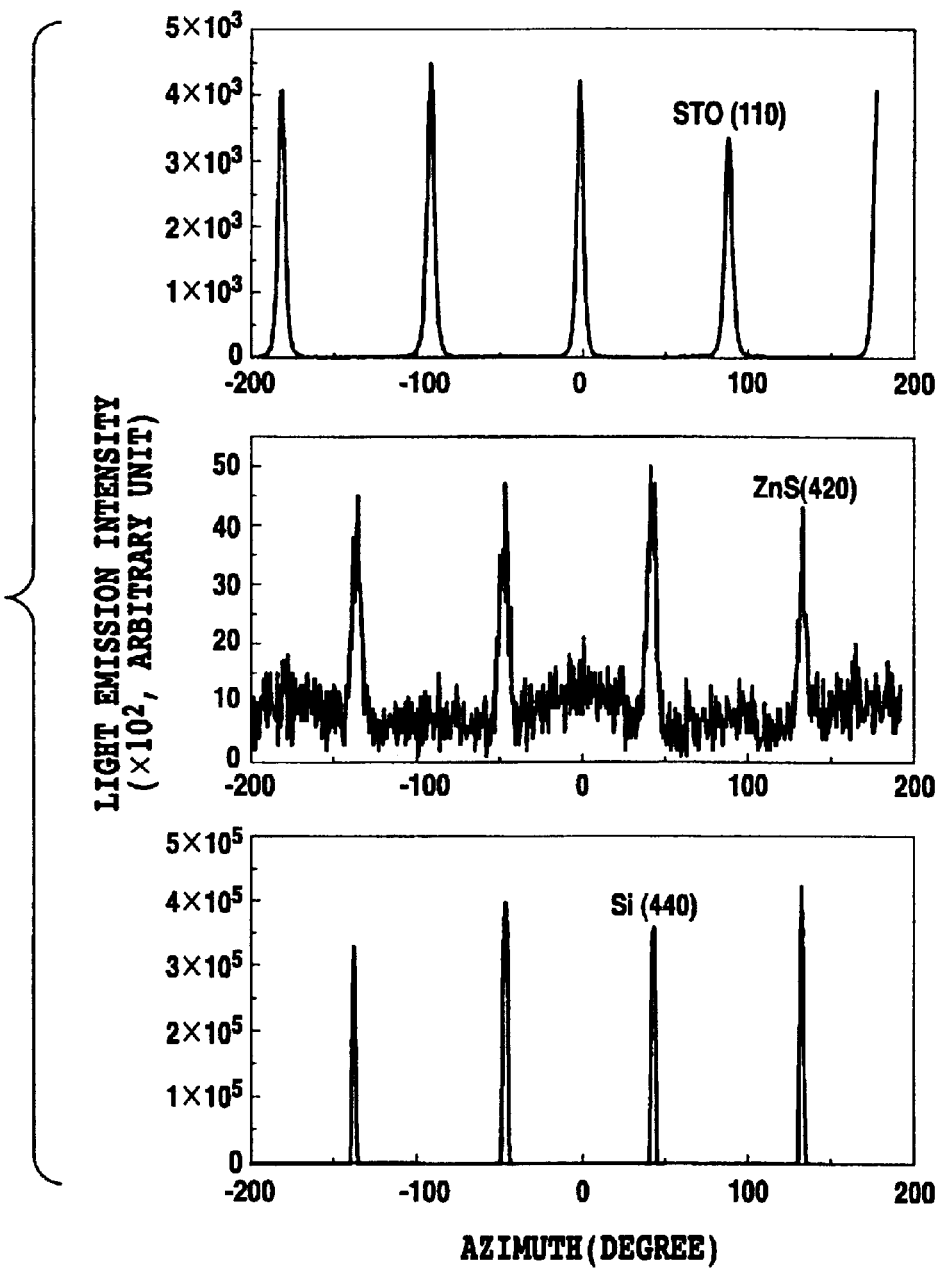
FIG. 15 shows diagrams illustrating the measurement results of XRD Phi (φ) scans of a STO/ZnS buffer layer deposited according to the invention.

FIG. 15 shows diagrams illustrating the measurement results of XRD Phi ($\phi$) scans of the STO/ZnS buffer layer deposited according to the invention. The drawing shown above shows symmetries for four times. Thus, it indicates that ZnS of the cubic zinc blend structure is epitaxially grown in the same orientation as Si in-plane, and the cubic STO is epitaxially grown thereon as rotating at a degree of 45.

Figure 16A:
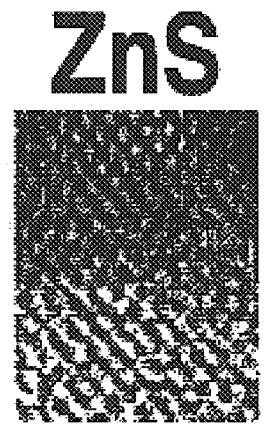
FIGS. 16A and 16B show diagrams illustrating sectional images of a STO/ZnS/Si thin film by transmission electron microscopy.
Figure 16B:
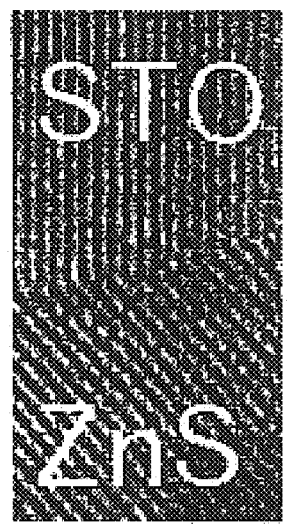

FIGS. 16A and 16B show diagrams illustrating cross sectional images of the STO/ZnS/Si thin film by transmission electron microscopy. FIG. 16A shows the ZnS/Si interface. FIG. 16B shows the STO/ZnS interface. Both of them are excellent interfaces.

Figure 17:
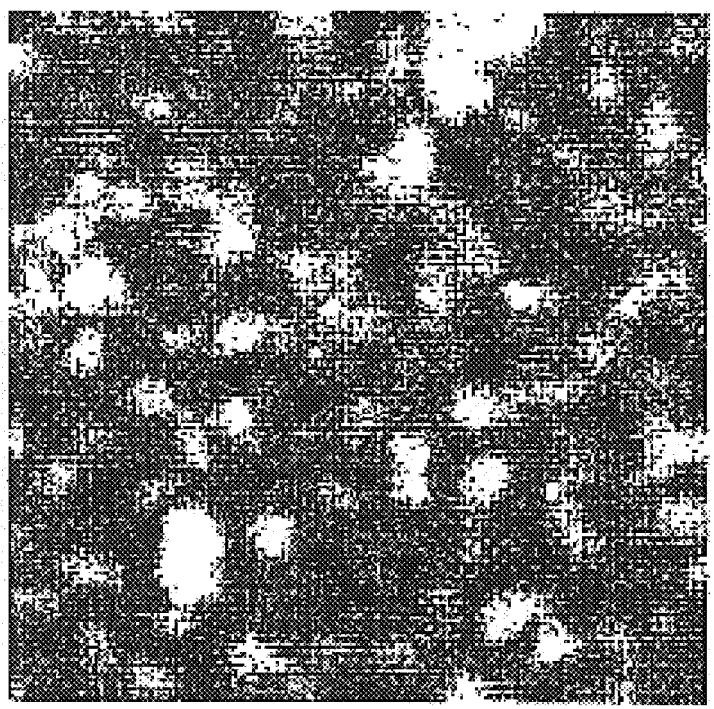
FIG. 17 shows a diagram illustrating an image of the surface appearance of a STO/ZnS/Si (111) thin film by atomic force microscopy, the thin film was deposited according to the invention.

FIG. 17 shows a diagram illustrating an image of the surface appearance of the STO/ZnS/Si (111) thin film by atomic force microscopy; the thin film was deposited according to the invention. A very flat film having the RMS of 1.8 nm is obtained. Accordingly, the STO/ZnS thin film is also excellent as the buffer layer structure as well as excellent in the structure for the capacitor device.

There is the case where the ionic crystal thin film is hardly epitaxially grown, because it tends to generate reactants with the zinc sulfide layer and generates reactants in the interface between the zinc sulfide layer and the ionic crystal layer in the stage of thin film growth. In this case, using the zinc sulfide layer deposited on the silicon single crystal substrate by epitaxial growth and a platinum group layer deposited thereon by epitaxial growth (they are combined and called a platinum group/ZnS buffer layer) as a substrate is effective to grow ionic crystals, which is an excellent scheme to obtain an ionic crystal thin film with high film quality. It is possible to epitaxially grow ionic crystals with excellent crystallinity on the platinum group/ZnS buffer layer proposed in the invention, which is an excellent scheme to provide a thin film device enhanced in characteristics.

The invention is effective in the case where an ionic crystal thin film has a lattice constant closer to that of platinum groups than that of zinc sulfide. Additionally, it is an excellent scheme in which the Si (100) substrate is used to form ZB-ZnS and a platinum group of the (100) orientation can be formed in the case of cubic crystal symmetry, and the Si (111) substrate is used to form W-ZnS and a platinum group of the (111) orientation can be formed in the case of hexagonal crystal symmetry, epitaxially growing ionic crystal thin films subsequently.

Specifically, the platinum groups to be deposited on the ZnS buffer layer deposited on the Si substrate are preferably rhodium, iridium, palladium, and platinum. These metals are noble metals belonging to the platinum groups, and all of them are considered to hardly be sulfurated to form a stable interface. Furthermore, these metals have a face centered cubic lattice structure, having a lattice constant of 0.38031 nm, 0.3839 nm, 0.3890 nm, and 0.3923 nm, respectively. The lattice constants of these are vary close to the square roots of one half of Si and ZnS (0.3840 nm and 0.3825 nm, respectively); matching of the lattice constants of the platinum groups with Si and ZnS is significantly excellent.

Accordingly, the layers of the platinum groups can be epitaxially grown on the ZnS buffer layer deposited on the Si substrate. When an ionic crystal thin film is deposited directly thereon, the interface of the under layer becomes stable. Moreover, a typical perovskite oxide has a lattice constant of about 0.39 nm. The lattice constants of the platinum groups show excellent matching thereto, and thus an epitaxial oxide thin film can be fabricated.

[Embodiment 4]

Figure 18:
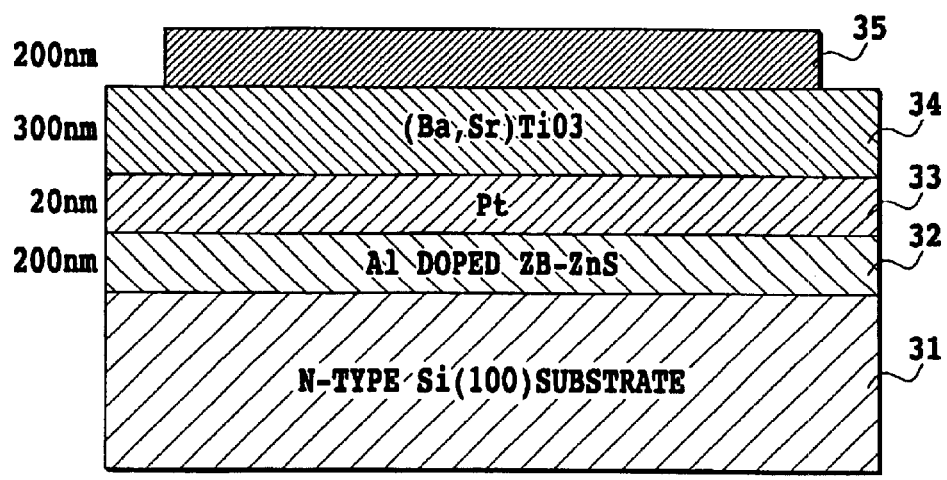
FIG. 18 shows a diagram illustrating a configuration of a BSTO/Pt/ZnS capacitor device fabricated according to the invention.

FIG. 18 shows a diagram illustrating a configuration of a BSTO/Pt/ZnS capacitor device fabricated according to the invention. In the drawing, 31 denotes an n-type Si (100) substrate, 32 denotes an Al doped ZB-ZnS layer (200 nm) deposited on the n-type Si (100) substrate 31, 33 denotes a Pt layer (20 nm) deposited on the Al doped ZB-ZnS layer 32, 34 denotes a (Ba, Sr)TiO$_3$ layer (300 nm) deposited on the Pt layer 33, and 35 denotes an upper electrode (200 nm) formed on the (Ba, Sr)TiO$_3$ layer 34. More specifically, the n-type Si (100) single crystal substrate 31 was used to deposit the zinc blend structural ZnS layer 32 of 200 nm in thickness, the Pt layer 33 was deposited 20 nm in thickness thereon, the (Ba, Sr)TiO$_3$ dielectric layer 34 was deposited, and subsequently the Pt upper electrode 35 was formed. A lower electrode is to be the Si substrate 31.

The thin film capacitor device having such the structure is fabricated as follows. First, the n-type Si (100) single crystal substrate was removed of a natural oxide film with Hydrogen Fluoride, cleaned with water, and then placed in a deposition chamber for vacuuming for about ten minutes. ZnS doped with one percent of Al was deposited about 200 nm in thickness at a substrate temperature of 750° C. by pulsed laser deposition. Then, Pt was deposited 10 nm in thickness at a substrate temperature of 400° C. by sputtering, and a substrate temperature is raised to 500° C. for further deposition 10 nm in thickness. Subsequently, (Ba, Sr)TiO$_3$ was deposited 300 nm in thickness by sputtering. Lastly, the upper electrode of Pt having an area of 0.5 mm in diameter was formed about 200 nm in thickness by sputtering. ZnS was doped with Al to have conductivity, and thus a capacitor having the Si substrate itself formed into the lower electrode was formed.

Figure 19:
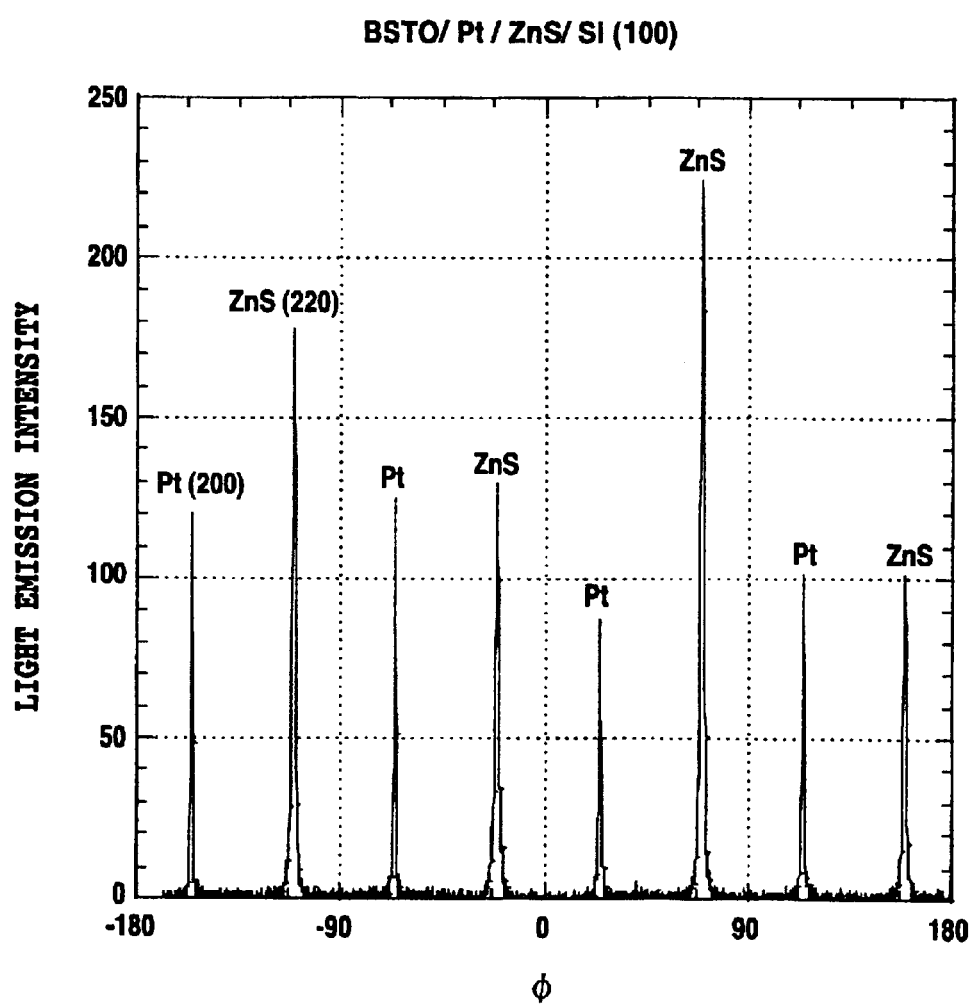
FIG. 19 shows a diagram illustrating the measurement results of XRD Phi (φ) scans of a Pt/ZnS buffer layer deposited according to the invention.

FIG. 19 shows a diagram illustrating the measurement results of XRD Phi ($\phi$) scans of the Pt/ZnS buffer layer deposited according to the invention. FIG. 19 shows symmetries for four times. Thus, it indicates that cubic Pt is epitaxially grown on ZnS of the cubic zinc blend structure.

Figure 20:
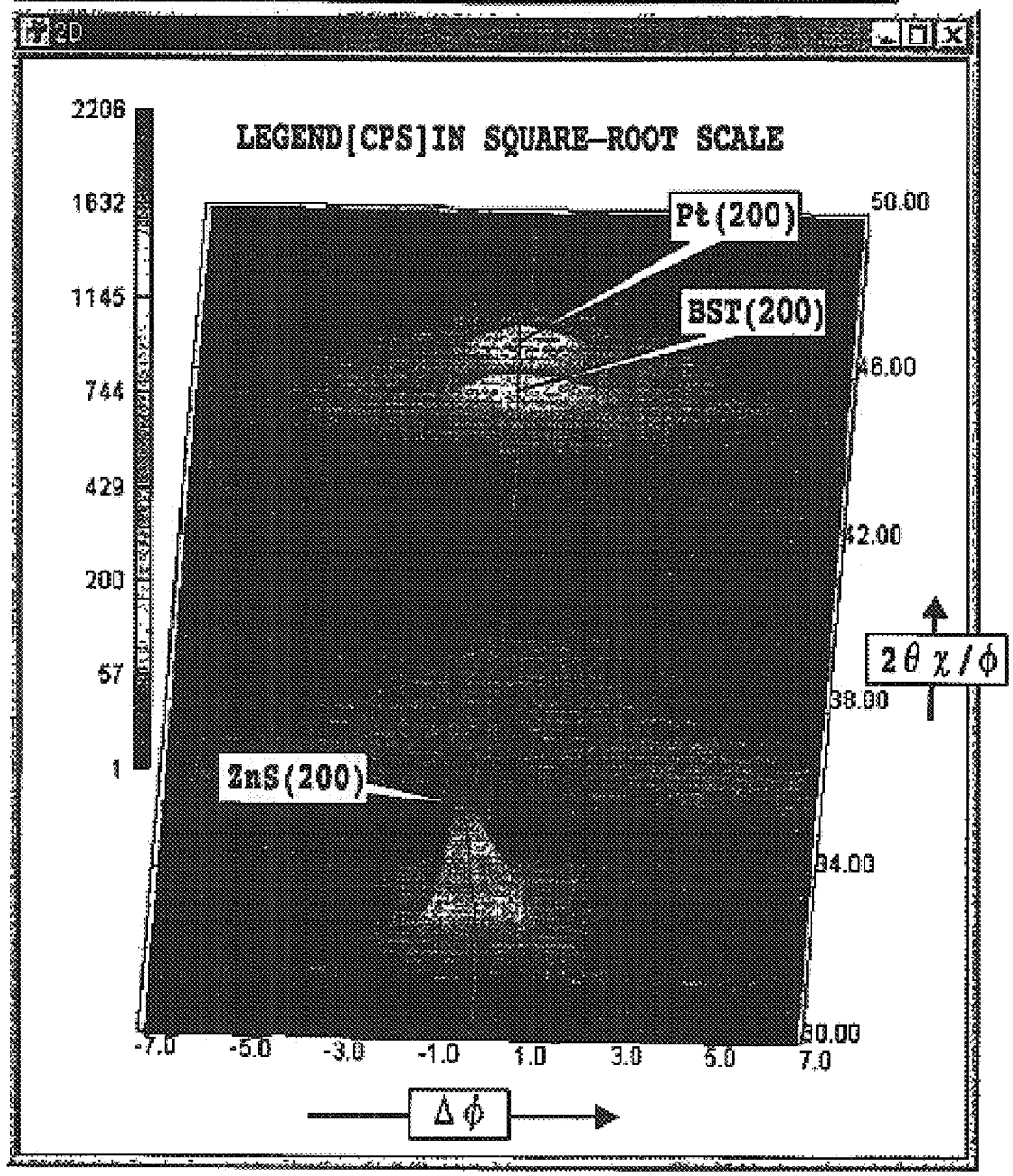
FIG. 20 shows a diagram illustrating the XRD-in-plane measurement results of a BSTO/Pt/ZnS/Si thin film deposited according to the invention.
Figure 20:
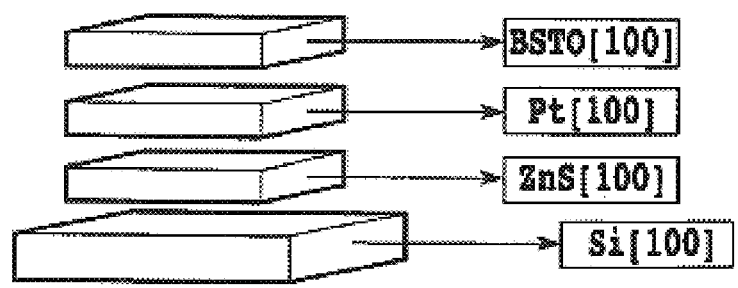

FIG. 20 shows a diagram illustrating the XRD-in-plane measurement results of the BSTO/Pt/ZnS/Si thin film, deposited according to the invention. It shows the peaks of ZnS (200), BSTO (200), and Pt (200) from smaller $2\theta$. The half value width of BSTO and Pt is about 2 deg., relatively wide, because the deposition conditions are not optimized. These measurement results confirmed that all the BSTO/Pt/ZnS/Si thin film is epitaxially grown, and a capacitor was fabricated.

Additionally, as the other thin film devices, a $(La, Sr)MnO_3/SrTiO_3/(La, Sr)MnO_3$ structure, described in Appl. Phys. Lett. 69, 3266 (1996) (J. Z. Sun, W. J. Gallagher, P. R. Duncombe, L. Krusin-Elbaum, R. A. Altman, A. Gupta, Yu Lu, G. Q. Gong, and Gang Xiao), can be used to fabricate a magnetometric sensor, for example. A ZnS buffer layer or buffer layer of ZnO/ZnS, STO/ZnS, and Pt/ZnS structures is epitaxially grown on a Si substrate, and $(La, Sr)MnO_3$, $SrTiO_3$, $(La, Sr)MnO_3$ are sequentially deposited thereon to fabricate the magnetometric sensor.

Furthermore, $(Pb, La)(Zr, Ti)O_3$, an oxide material having electro-optic effects, described in National Technical Report, Vol. 33, No.6, p. 687 (1987), can be used to fabricate an optical switching thin film device. A ZnS buffer layer or buffer layer of ZnO/ZnS, STO/ZnS, and Pt/ZnS structures is epitaxially grown on a Si substrate, and $Ta_2O_5$ and $(Pb, La)(Zr, Ti)O_3$ are sequentially deposited thereon to fabricate the optical switching thin film device.

The present invention has been described in detail with respect to preferred embodiments, and it will now be those skilled in the art that changes and modifications may be made without darting from the invention in its broader aspects, and it is the intention, therefore, in the appended claims to cover all such changes and modifications as fall within the true spirit of the invention.

What is claimed is:

1. A thin film device comprising:

a buffer layer which is an epitaxial layer having a zinc sulfide layer deposited on a silicon single crystal substrate; and a thin film comprising an epitaxial layer of a compound having ionic bonds deposited on the buffer layer.

2. The thin film device according to claim 1, wherein a metal nitride thin film is used as the compound thin film.

3. The thin film device according to claim 1, wherein a metal oxide thin film is used as the compound thin film.

4. The thin film device according to claim 1, wherein a metal sulfide thin film is used as the compound thin film.

* * * * *

UNITED STATES PATENT AND TRADEMARK OFFICE
CERTIFICATE OF CORRECTION

PATENT NO.    : 6,888,156 B2
DATED         : May 3, 2005
INVENTOR(S)   : Toyohiro Chikyo et al.

It is certified that error appears in the above-identified patent and that said Letters Patent is hereby corrected as shown below:

Title page,
Item [75], Inventors, change "Toyohiro Chikyow" to -- Toyohiro Chikyo --; and change "Yoo Young Zo" to -- Young Zo Yoo --.

Signed and Sealed this

Thirteenth Day of December, 2005

JON W. DUDAS
*Director of the United States Patent and Trademark Office*